(12) United States Patent
Leng et al.

(10) Patent No.: US 7,022,583 B1
(45) Date of Patent: Apr. 4, 2006

(54) METHOD OF FORMING A SHALLOW TRENCH ISOLATION DEVICE TO PREVENT KICK EFFECT

(75) Inventors: DeXue Leng, Shanghai (CN); Wang Zheng, Shanghai (CN)

(73) Assignee: Grace Semiconductor Manufacturing Corporation, Shanghai (CN)

( * ) Notice: Subject to any disclaimer, the term of this patent is extended or adjusted under 35 U.S.C. 154(b) by 0 days.

(21) Appl. No.: 10/996,362

(22) Filed: Nov. 26, 2004

(51) Int. Cl.
*H01L 21/76* (2006.01)

(52) U.S. Cl. ...................................... 438/424; 257/513

(58) Field of Classification Search ................ 438/286, 438/239, 248, 692, 693, 697, 700, 652, 657, 438/789, 760, 303, 386, 391, 425, 427, 435, 438/424, 437, 246, 242–244, 526, 299, 283, 438/189, 199, 592
See application file for complete search history.

(56) References Cited

U.S. PATENT DOCUMENTS 6,118,168 A * 9/2000 Moon et al. ................. 257/513
2002/0197823 A1* 12/2002 Yoo et al. .................... 438/424

* cited by examiner

*Primary Examiner*—Michael Lebentritt
*Assistant Examiner*—Andre' C. Stevenson
(74) *Attorney, Agent, or Firm*—Rosenberg, Klein & Lee

(57) ABSTRACT

A method of forming a shallow trench isolation device in order to prevent kick effects comprising a semiconductor structure having a patterned masking layer formed thereon. A shallow trench is formed in the semiconductor structure by using the patterned masking layer as a mask. A liner oxide layer and a doped dielectric layer are formed in sequence on the semiconductor structure to cover the surface of the shallow trench. A layer of oxide is formed on the semiconductor structure to fill the shallow trench. The dopants in the doped dielectric layer diffuse into the semiconductor structure surrounding the shallow trench to form an ion doped area, thereby increasing the threshold voltage caused by the recess on the corner structure in order to prevent the kick effect.

9 Claims, 6 Drawing Sheets

METHOD OF FORMING A SHALLOW TRENCH ISOLATION DEVICE TO PREVENT KICK EFFECT

BACKGROUND OF THE INVENTION

1. Field of the Invention

The present invention relates to a method of forming a shallow trench isolation device, in particular, to a method of forming a shallow trench isolation device in order to prevent kick effects.

2. Description of the Prior Art

As device technology is scaled down to the quarter micron region, the use of conventional local oxidation of silicon (LOCOS) isolation is confined by smaller channel-width encroachment (bird's beak). Shallow trench isolation (STI) can be used to eliminate these encroachments, especially in ultra large scale integrated (ULSI) circuit devices.

Therefore, the shallow trench isolation (STI) method has been developed for highly integrated circuits, and sub-half micron integrated circuits in particular. A shallow trench isolation (STI) structure is formed by performing an anisotropic etching operation using a silicon nitride hard mask to form a steep-sided trench in a semiconductor substrate. Oxide material is deposited into the trench to form an oxide plug. However, the aforementioned method of STI fabrication often results in the formation of recess cavities, resulting in a locally intensified electric field. This leads to an abnormal sub-threshold current leakage in the transistor channel, resulting in the intensification of the kick effect. As shown in FIG. 1, a trench 12 is formed in a semiconductor substrate 10. A pad oxide layer 14 is formed in the surface of the trench 12 and an oxide 16 is filled therein, thereby forming a shallow trench isolation device. During this process, after forming the conventional trench devices, a recess phenomenon is usually formed on the corner structure 18 due to the dishing of the liner oxide layer 14 and the oxide 16. In the subsequent process, polysilicon and other materials are filled in the recess on the corner structure 18, thereby reducing the threshold voltage (Vt) and diverging a specific value of device. Therefore, the electrical quality of the device is reduced and a kick effect occurs in the device.

In the view of this, the present invention provides a method of forming a shallow trench isolation device in order to prevent kick effects in order to overcome the above-mentioned disadvantages.

SUMMARY OF THE INVENTION

The present invention provides a method of forming a shallow trench isolation device in order to prevent kick effects, in which the threshold voltage caused by the recess on the corner structure is reduced by using a doped dielectric layer on the liner oxide layer to effectively increase the threshold voltage and to reduce the recess.

The present invention also provides a method of forming a shallow trench isolation device in order to prevent kick effects, in which the kick effect is effectively reduced, thereby improving the device characteristics and the electrical quality.

To achieve the aforementioned objects, a preferred embodiment of the present invention provides a method of forming a shallow trench isolation device in order to prevent kick effects. A patterned masking layer is formed on the semiconductor structure to form a shallow trench. A liner oxide layer and a doped dielectric layer are formed in sequence on the semiconductor structure to cover the surface of the shallow trench. A layer of oxide is formed on the semiconductor structure to fill the shallow trench. The dopants in the doped dielectric layer diffuse into the semiconductor structure surrounding the shallow trench. The remaining oxide and the patterned masking layer on the surface of the semiconductor structure are removed to form a trench isolation device.

These and other objectives of the present invention will become obvious to those of ordinary skill in the art after reading the following detailed description of the preferred embodiment.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION OF THE PREFERRED EMBODIMENTS

Figure 1:
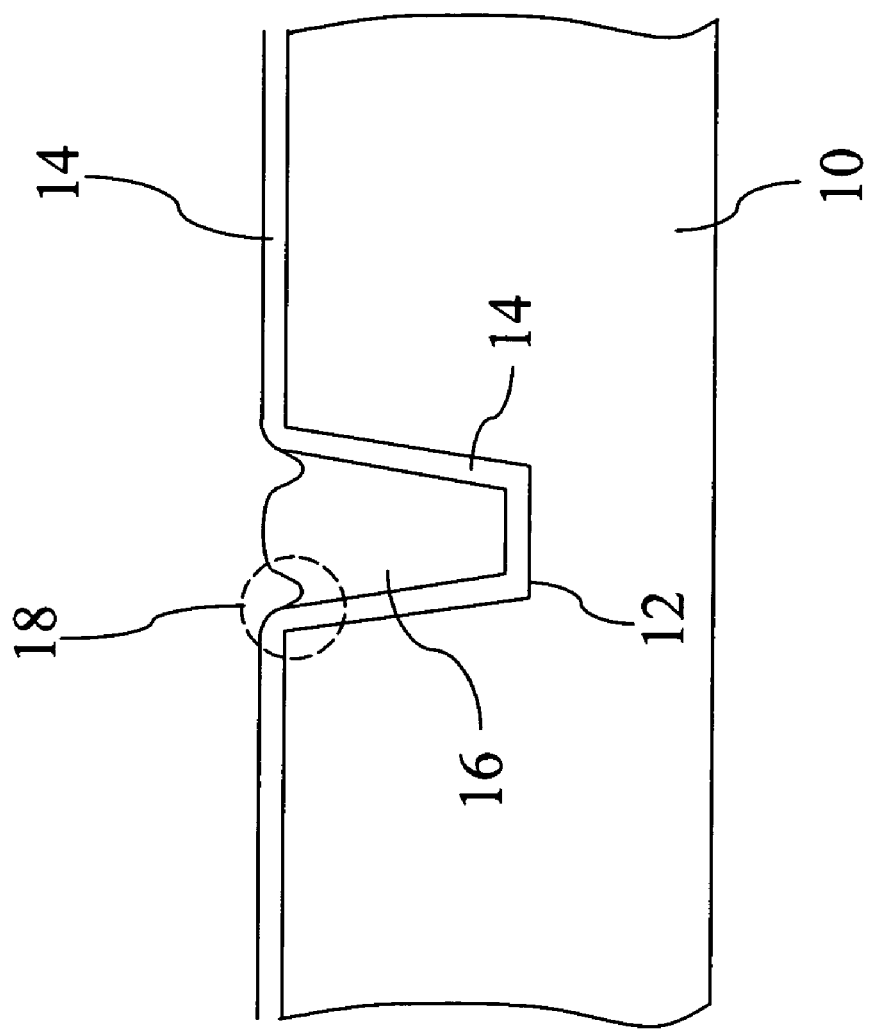
FIG. 1 is a cross section of a conventional shallow trench isolation device.

According to the conventional process, the recess cavity in the shallow trench isolation results in the kick effect, thereby affecting the yield and the electrical quality of the device. The present invention uses the doping treatment of the doped dielectric layer on the liner oxide to overcome the above-mentioned disadvantages, thereby preventing the recess and the kick effect and maintaining the device characteristics.

While the present invention may be embodied in many different forms, there is shown in the drawings and discussed herein a few specific embodiments with the understanding that the present disclosure is to be considered only as an exemplification of the principles of the invention and is not intend to limit the invention to the embodiments illustrated.

Figure 2A:
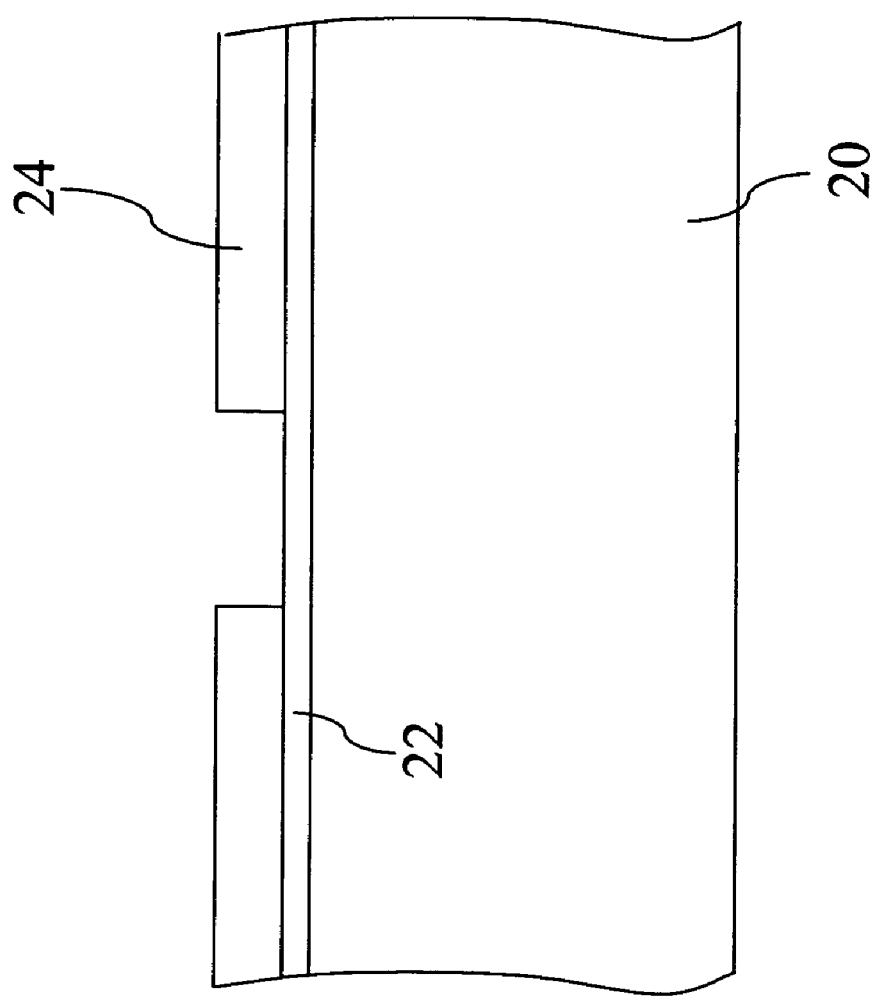
FIGS. 2a through 2e are cross sections of a shallow trench isolation device according to an embodiment of the present invention.

As shown in FIGS. 2a through 2e, the present invention provides the following steps. As shown in FIG. 2a, a semiconductor substrate 20 is provided. A pad oxide layer 22 is formed on the surface of the semiconductor substrate 10 by using Chemical Vapor Deposition (CVD). The pad oxide layer 22 is typically composed of $SiO_2$. A patterned silicon nitride masking layer 24 is formed on the surface of the pad oxide layer 22 by photolithography.

In this embodiment of the present invention, the semiconductor substrate 20 having the pad oxide layer 22 is used as a semiconductor structure. In addition, the semiconductor structure can also comprise a Silicon On Insulator (SOI) structure, or a semiconductor device consisting of an inter-layer dielectric (ILD) structure.

Figure 2B:
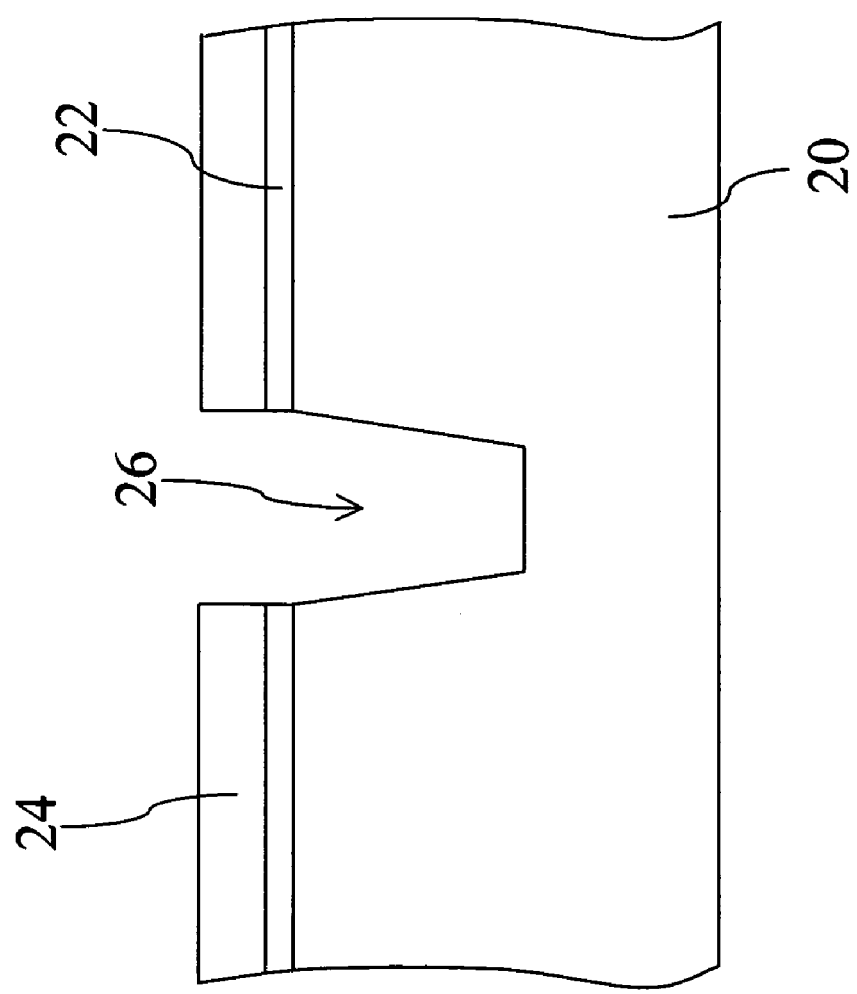

Next, using the patterned silicon nitride masking layer 24 as a mask, the pad oxide layer 22 uncovered by the patterned silicon nitride masking layer 24 is removed by a conventional etching process. As shown in FIG. 2b, after the exposed pad oxide layer 22 and the semiconductor substrate 20 are removed by the etching, a shallow trench structure 26 is formed on the semiconductor substrate 20.

Figure 2C:
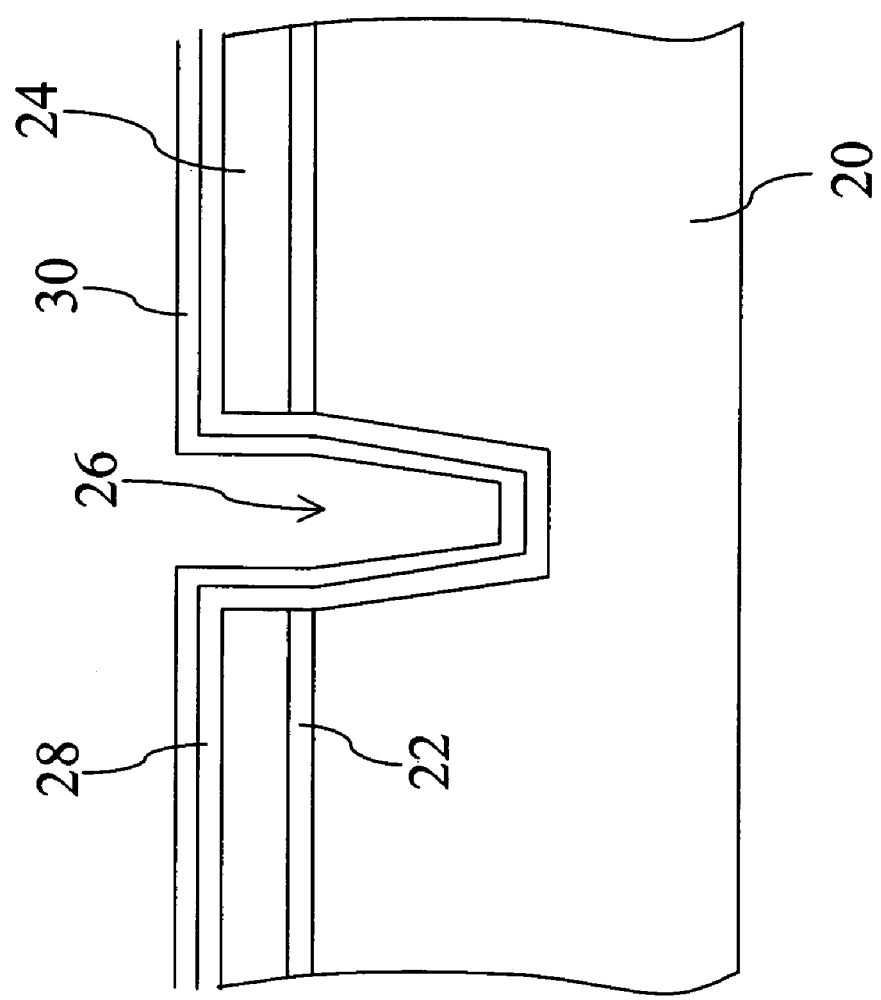

A high-temperature thermal oxidation is performed, as shown in FIG. 2c. A liner oxide layer 28 is formed on the semiconductor substrate 20 to cover the surface of the shallow trench structure 26 for isolating protection. A borophosphosilicate glass (BPSG) layer 30 is formed on the surface of the liner oxide layer 28 used as a doped dielectric layer. The BPSG layer 30 is covered on the shallow trench structure 26. The dopants in the BPSG layer 30 are boron ions.

Figure 2D:
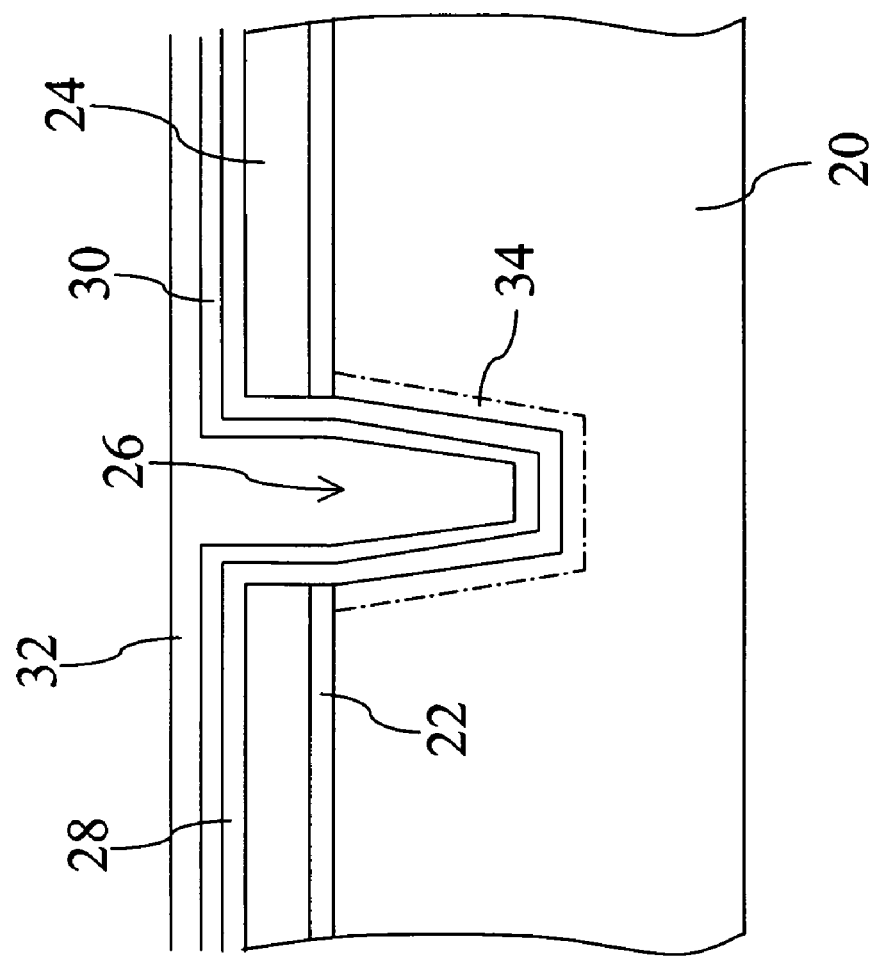

As shown in FIG. 2d, a layer of oxide 32 is formed on the semiconductor substrate 20 by using High Density Plasma (HDP), thereby filling the oxide 32 in the shallow trench structure 26 to cover the surface of BPSG layer 30. The boron dopants in the BPSG layer 30 diffuse into the semiconductor substrate 20 surrounding the shallow trench structure 26, resulting in forming a boron doped area 34.

Figure 2E:
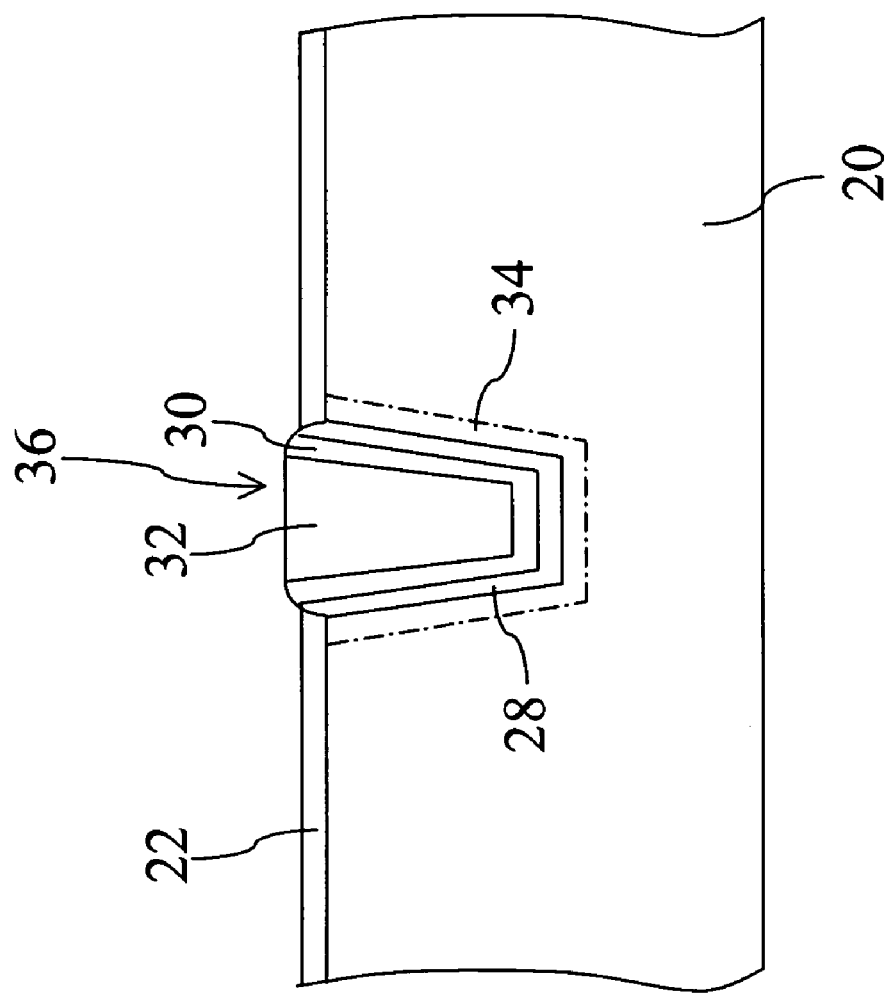

The remaining oxide 32, the BPSG layer 30, the liner oxide layer 28, and the patterned silicon nitride masking layer 24 on the surface of the semiconductor substrate 20 are removed by using Chemical mechanical polishing or Plasma etching, resulting in forming a shallow trench isolation device 36 as shown in FIG. 2e. The present invention uses the formation of the BPSG layer 30 to form a boron doped area 34 in the semiconductor substrate 20 outside the liner oxide layer 28, in order to solve the reduced threshold voltage caused by the recess cavity of the conventional process, thereby preventing the kick effect. In additional, even if the recess phenomenon is formed on the corner structure, the present invention increases the threshold voltage to effectively reduce the kick effect.

The doped dielectric layer can not only use BPSG for the material, but also can use boron nitride (BN) or $POCl_3$. The dopants in the doped dielectric layer comprise N-type or P-type.

Therefore, the present invention provides a shallow trench isolation device process. While forming the shallow trench isolation device, the threshold voltage caused by the recess on the corner of the shallow trench is lowered. The doped dielectric layer on the liner oxide layer is used to increase the threshold voltage and to reduce the recess phenomenon effectively, thereby reducing the kick effect, resulting in improving the device characteristics and the electrical quality.

The embodiment above is only intended to illustrate the present invention; it does not, however, limit the present invention to the specific embodiment. Accordingly, various modifications and changes may be made without departing from the spirit and scope of the present invention as described in the following claims.

What is claimed is:

1. A method of forming a shallow trench isolation device to prevent kick effect, comprising:

providing a semiconductor structure having a patterned masking layer formed thereon;

etching a portion of the semiconductor structure using the patterned masking layer as a mask to thereby form a shallow trench;

forming an undoped liner oxide layer on the semiconductor structure to cover a surface of the shallow trench;

forming a doped dielectric layer on the undoped liner oxide layer to cover the shallow trench, the doped dielectric layer being formed of a material selected from the group consisting of borophosphosilicate glass (BPSG), boron nitride (BN), and $POCl_3$;

forming a layer of oxide on the semiconductor structure to fill the shallow trench, wherein dopants in the doped dielectric layer diffuse into the semiconductor structure surrounding the shallow trench; and removing the remaining oxide and the patterned masking layer on the surface of the semiconductor structure to form a trench isolation device.

2. The method of forming a shallow trench isolation device to prevent kick effect of claim 1, wherein the step of providing a semiconductor structure includes the step of providing a semiconductor substrate with a pad oxide layer thereon.

3. The method of forming a shallow trench isolation device to prevent kick effect of claim 2, wherein the pad oxide layer comprises silicon oxide.

4. The method of forming a shallow trench isolation device to prevent kick effect of claim 1, wherein the patterned masking layer is a patterned silicon nitride masking layer.

5. The method of forming a shallow trench isolation device to prevent kick effect of claim 1, wherein the step of forming an undoped liner oxide includes the step of forming the liner oxide by high-temperature thermal oxidation.

6. The method of forming a shallow trench isolation device to prevent kick effect of claim 1, wherein the step of forming a layer of oxide includes the step of forming the layer of oxide by High Density Plasma (HDP).

7. The method of forming a shallow trench isolation device to prevent kick effect of claim 1, wherein the dopants diffusing into the semiconductor structure adjust the threshold voltage of devices.

8. The method of forming a shallow trench isolation device to prevent kick effect of claim 1, wherein the step of providing a semiconductor substructure includes the step of providing a Silicon On Insulator (SOI) structure.

9. The method of forming a shallow trench isolation device to prevent kick effect of claim 1, wherein the step of providing a semiconductor substructure includes the step of providing an inter-layer dielectric (ILD) structure.

* * * * *